United States Patent [19]

Hayes et al.

[11] Patent Number: 5,173,605

[45] Date of Patent: Dec. 22, 1992

[54] COMPACT TEMPERATURE-COMPENSATED TUBE-TYPE SCANNING PROBE WITH LARGE SCAN RANGE AND INDEPENDENT X, Y, AND Z CONTROL

[75] Inventors: John B. Hayes; Jamshid Jahanmir; Eric M. Frey, all of Tucson, Ariz.

[73] Assignee: Wyko Corporation, Tucson, Ariz.

[21] Appl. No.: 848,106

[22] Filed: Mar. 9, 1992

Related U.S. Application Data

[63] Continuation-in-part of Ser. No. 694,827, May 2, 1991, Pat. No. 5,103,094.

[51] Int. Cl.$^5$ ............................................. G01N 23/00
[52] U.S. Cl. ..................................... 250/306; 250/307; 310/328; 310/331; 310/332
[58] Field of Search ............... 310/328, 331, 332, 366; 250/306, 307, 309, 310, 311, 442.1

[56] References Cited

U.S. PATENT DOCUMENTS

| | | | |
|---|---|---|---|
| 3,325,780 | 6/1967 | Horan | 310/331 |
| 4,343,993 | 8/1982 | Binnig et al. | 250/306 |
| 4,510,412 | 4/1985 | Suda et al. | 310/328 |
| 4,785,177 | 11/1988 | Besocke | 250/442.1 |
| 4,798,989 | 1/1989 | Miyazaki et al. | 310/328 |
| 4,841,148 | 6/1989 | Lyding | 250/306 |
| 4,871,938 | 10/1989 | Elings et al. | 310/330 |
| 4,945,235 | 7/1990 | Nishioka et al. | 250/306 |
| 4,987,303 | 1/1991 | Takase et al. | 250/306 |
| 4,992,728 | 2/1991 | McCord et al. | 324/158 P |
| 5,103,094 | 4/1992 | Hayes et al. | 250/306 |

FOREIGN PATENT DOCUMENTS 63-238503 10/1988 Japan .

OTHER PUBLICATIONS

"A Compact Scanning Tunnelling Microscope With Thermal Compensation", by Albrektsen et al., J. Phys. E. Sci. Instrum. 22 (1989), pp. 39-42.
"High-Stability Bimorph Scanning Tunneling Microscope", by B. L. Blackford, D. C. Dahn, and M. H. Jericho, 1987 American Institute of Physics, Rev. Sci. Instrum. 58(8), Aug., 1987, pp. 1343-1348.

*Primary Examiner*—Jack I. Berman
*Assistant Examiner*—James Beyer
*Attorney, Agent, or Firm*—Charles R. Hoffman

[57] ABSTRACT

A scanning probe microscope includes a base, an inner piezoelectric tube, and an outer piezoelectric tube, with a first end of the outer piezoelectric tube connected to the base. A first end of the inner piezoelectric tube is rigidly connected to a second end of the outer piezoelectric tube. Thin inner conductors are disposed on the inner surfaces of the inner piezoelectric tube and the outer piezoelectric tube, and quadrant conductors are disposed on the outer surfaces of the inner piezoelectric tube and the outer piezoelectric tube. Separate x, y, and z scan control voltage signals are applied to various quadrant conductors of the inner and outer piezoelectric tubes to control scanning of the free end of the inner tube in the x, y, and z directions, respectively.

16 Claims, 5 Drawing Sheets

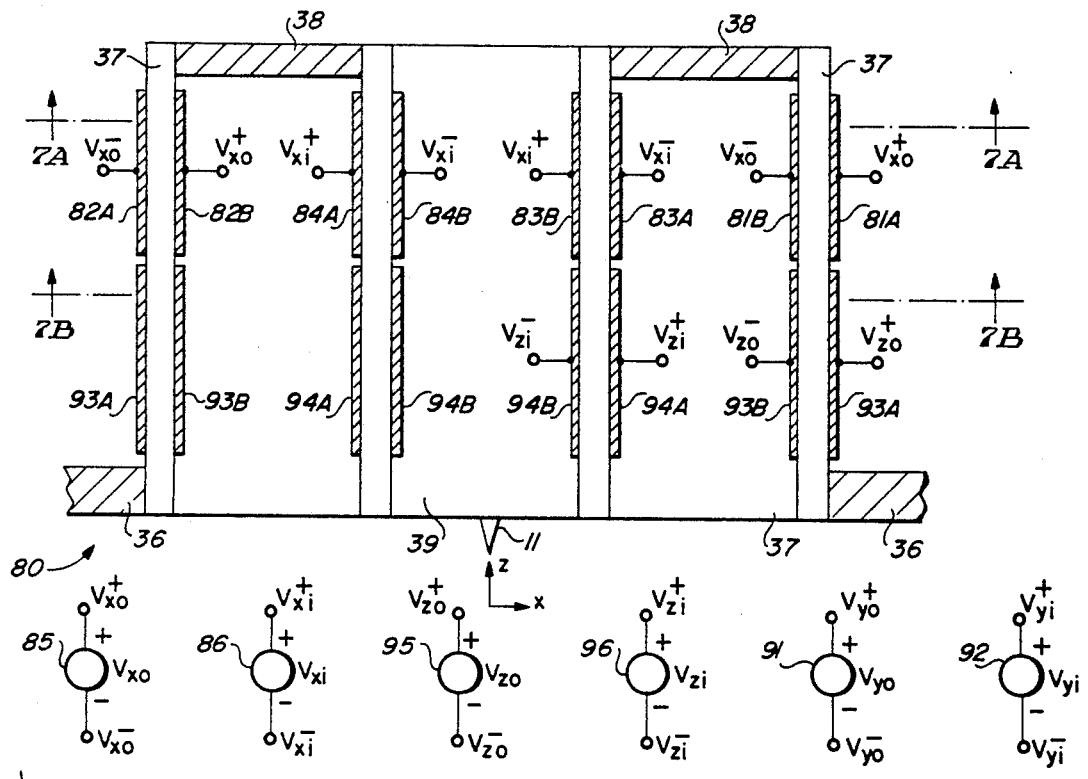
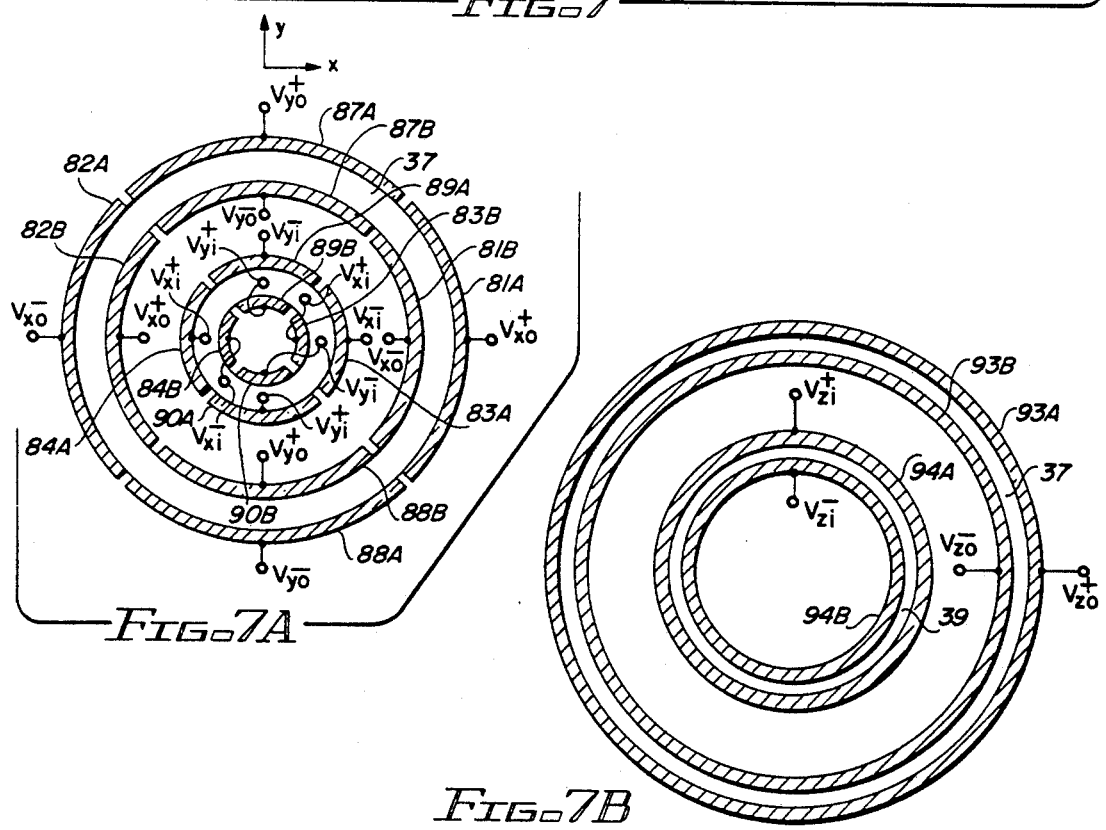

COMPACT TEMPERATURE-COMPENSATED TUBE-TYPE SCANNING PROBE WITH LARGE SCAN RANGE AND INDEPENDENT X, Y, AND Z CONTROL

CROSS-REFERENCE TO RELATED APPLICATION

This application is a continuation-in-part of the commonly assigned allowed application entitled "COMPACT TEMPERATURE-COMPENSATED TUBE-TYPE SCANNING PROBE WITH LARGE SCAN RANGE", Ser. No. 694,827, filed May 2, 1991, now U.S. Pat. No. 5,103,094 by inventors John B. Hayes, Jamshid (nmi) Jahanmir, and Eric M. Frey.

BACKGROUND OF THE INVENTION

The invention relates to temperature-compensated scanning probe microscopes (SPMs), particularly "tube scanner" type SPMs.

The prior art includes scanning tunneling microscopes (STMs) of the type shown in FIGS. 1 and 2. FIG. 1 shows an atomic resolution scanning tunneling microscope of the type developed by Binnig and Rohrer. The design shown in FIG. 1 is referred to as a "tripod design". Tripod "scanning heads" are known to have problems with thermal drift and interaction between the x, y, and z piezoelectric transducers 13, 14, and 15 as shown in FIG. 1. Actuation of one of piezoelectric transducers 13, 14, or 15 that is intended to produce movement of probe 11 (and atom 12 on the lower tip of probe 11) along its corresponding x, y, or z axis inevitably produces some movement along the other two axes. In FIG. 1, numeral 16 designates an article to be scanned, and numeral 17 designates electrons on the surface of article 16 which may "tunnel" up to atom 12 when atom 12 gets within approximately a few Angstroms of the immediately underlying feature of sample 16. This produces a current I which is sensed by a current measuring device 19. Numeral 20 indicates a bias voltage applied to probe 11 to produce the tunneling effect.

"Tube scanner" STMs were developed by Binnig and Smith. In these devices, a single piezoelectric cylindrical tube, with its outer electrode divided into four equal quadrants parallel to the tube's cylindrical axis, provides lateral scanning motion at a free end of the tube (the other end of the tube being stationary), by bending when voltages are applied to adjacent outside quadrants. The prior tube scanner device also produces lateral displacement along the z axis when a common voltage is applied to all four quadrant conductors relative to the grounded inner electrode of the tube. Such tube scanner designs suffer from thermal drift along the z axis. In order to achieve a long scan range, such prior art tube scanners have a large axial dimension and a low mechanical resonance frequency, and hence are subject to mechanical vibrations which make it much more difficult to accurately move the probe tip 11 over the surface 17, because low frequency vibrations inherently are of larger amplitude, and also are more easily excited than high frequency vibrations. Larger amplitude vibrations make it much more difficult to maintain a constant distance between the probe tip and the surface being scanned. Such prior tube-type scanners also are undesirably large.

The several Angstrom distance of the probe tip to the sampled surface is so small that any low frequency mechanical vibration makes it very difficult for the electronic feedback loop to permit accurate scanning or tracking of the probe tip over the surface features. Any large scanning tube inherently has a lower mechanical resonance frequency and consequently is more problematic in this respect than a physically smaller scan tube. Large scanning tubes also inherently are much more sensitive to thermal variations, the magnitude of which are proportional to physical size.

The problem of thermal sensitivity is addressed in U.S. Pat. No. 4,841,148 (Lyding), which discloses an STM that is thermally compensated by providing a pair of concentric piezoelectric tubes of the same length and composition. A tunneling probe is attached to a free end of the inner tube, which is divided into equal lateral quadrants for providing transverse and axial scanning motion. In this device, shown in FIG. 2 hereof, the sample holder 32 rests on two spaced rods 31 attached to the outer end of tube 25. Support element 32 supports test surface 17. The dimensions and thermal expansion coefficient of inner tube 26 and outer tube 25 are identical, so as to compensate for thermal variations in the lengths of both tubes. The distance between the tip of probe 11 and the surface 17 of the sample 16 is relatively unaffected by temperature variations of the piezoelectric tubes 25 and 26 because temperature-caused expansion and contraction of the inner and outer tubes in the directions of arrows 33 and 33A are equal.

The Lyding device provides no solution to the above-mentioned problems of achieving a large scan range unless a large structure that has low mechanical resonance frequencies is used. Consequently, the Lyding device is relatively unsuitable for achieving a large scan range. An STM of the Lyding design would need to have its piezoelectric tubes approximately three to six inches long in order to achieve a scan range of roughly 100 microns. Furthermore, it is designed for horizontal mounting only, and is totally unsuitable for vertical mounting because the technique for supporting the sample holder relies on gravity to hold sample holder 32 on rails 31.

It would be desirable to be able to control scanning in the x, y, and z directions with separate, corresponding control voltages applied to separate electrodes on the piezoelectric tube, because if the control signals are combined, the motion of the free end of the tube in one direction due to one component of the combined control signal can offset the sensitivity of the piezoelectric device to another component of the combined control signal.

Abandoned patent application Ser. No. 305,637, by Elings et al., filed Feb. 3, 1989, and incorporated by reference in U.S. Pat. No. 5,051,646 issued Sep. 24, 1991 by the same inventors, entitled "SCANNER FOR A SCANNING PROBE MICROSCOPE", discloses four inner scan electrodes attached to the inner surface of an elongated cylindrical piezoelectric tube having a fixed end and a free end, and four outer scan electrodes attached to the outer surface and aligned, respectively, with the inner electrodes and application of separate x and y scan voltages to control scanning of the probe in the x and y directions. A cylindrical electrode is attached to an inner surface of another portion of the piezoelectric tube and outer cylindrical electrode attached to the outer surface thereof. Another voltage source controls scanning of the electrode in the z direction.

There is an unmet need for an improved compact scanning probe microscope which is thermally compensated, provides large axial and lateral motion of a tube type scanning probe along a test surface, and avoids low mechanical resonance frequencies which interfere with accurate profiling, and which allows separate voltages to control movement in the x, y, and z directions, respectively.

SUMMARY OF THE INVENTION

Accordingly, it is an object of the invention to provide an improved compact temperature-compensated tube-type scanning probe microscope head with a large scan range.

It is another object of the invention to solve the problems of low mechanical resonance frequencies that interfere with profiling accuracy in the relevant prior art devices.

It is another object of the invention to provide a tube-type scanning probe microscope having the capability of a wide field of view in combination with a very fine or precise scan range within the field of view.

It is another object of the invention to provide a tube-type scanning probe microscope having a wide field of view in combination with a very precise scan range within the field of view and also producing scan movement in the x, y, and z directions by means of separate control voltages, respectively.

Briefly described, and in accordance with one embodiment thereof, the invention provides a scanning probe microscope including a base, an inner piezoelectric tube, and an outer piezoelectric tube. A first end of the outer piezoelectric tube is connected rigidly to the base. A first end of the inner piezoelectric tube is connected in fixed relationship to a second end of the outer piezoelectric tube. An inner conductor is disposed on the inner surface of each of the inner piezoelectric tube and the outer piezoelectric tube. Four quadrant conductors are disposed on the outer surface of each of the inner piezoelectric tube and the outer piezoelectric tube. A reference voltage is applied to the inner conductor of the outer piezoelectric tube and to the inner conductor of the inner piezoelectric tube. Separate x, y, and z scan control voltages are applied to the various groups of the quadrant conductors, respectively, of the outer piezoelectric tube and the inner piezoelectric tube to cause movement of the second end of the outer piezoelectric tube in the x, y, and z directions, respectively. A probe having a sensing tip is connected either to the second end of the inner piezoelectric tube or to a fixed support. A sample is connected to the other of a fixed support or the second end of the inner piezoelectric tube. A control system measures current or other parameter(s) sensed by the sensing tip of the probe. The current or parameter(s) indicates the distance of the probe tip from the scanned surface for each value of x, y to control application of the quadrant voltages. The x, y, and z voltages represent the x, y, and z parameters of each point of the scanned surface, and hence the profile of the scanned surface.

BRIEF DESCRIPTION OF THE DRAWINGS

FIG. 7 is a section view diagram of an embodiment of the invention using separate voltages for controlling scanning in the x, y, and z directions, respectively.

FIG. 7A is a section view taken along section line 7A—7A of FIG. 7.

FIG. 7B is a section view taken along section line 7B—7B of FIG. 7.

DETAILED DESCRIPTION OF THE PREFERRED EMBODIMENT

Figure 1:
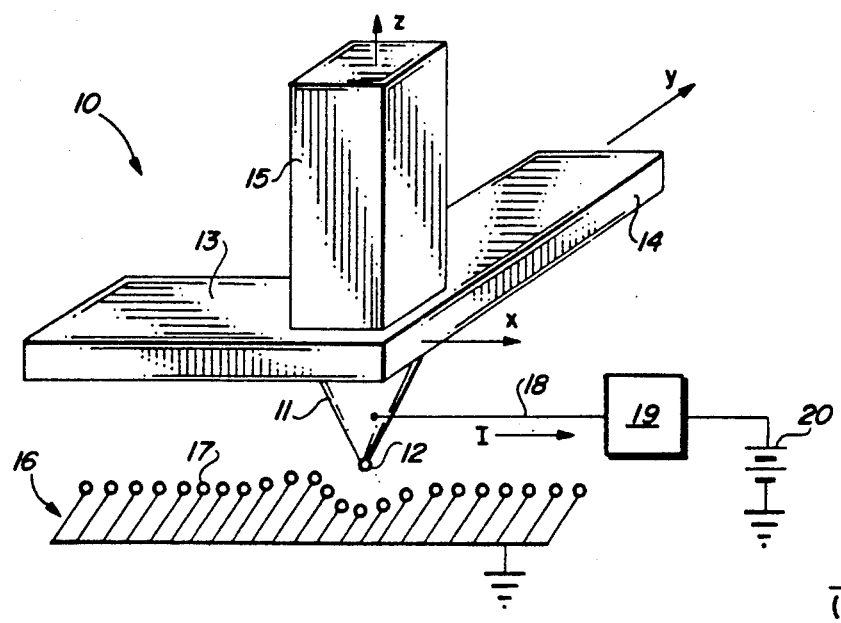
FIG. 1 is a perspective view diagram of a tripod type scanning tunneling microscope of the prior art.
Figure 2:
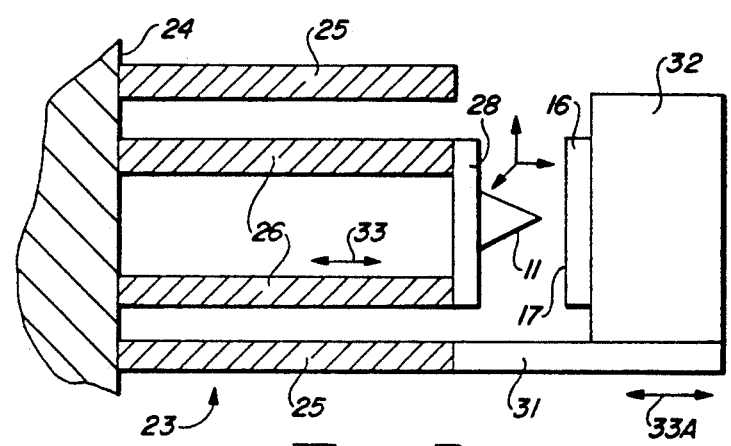
FIG. 2 is a section view diagram of a tube type prior art scanning tunneling microscope.
Figure 3:
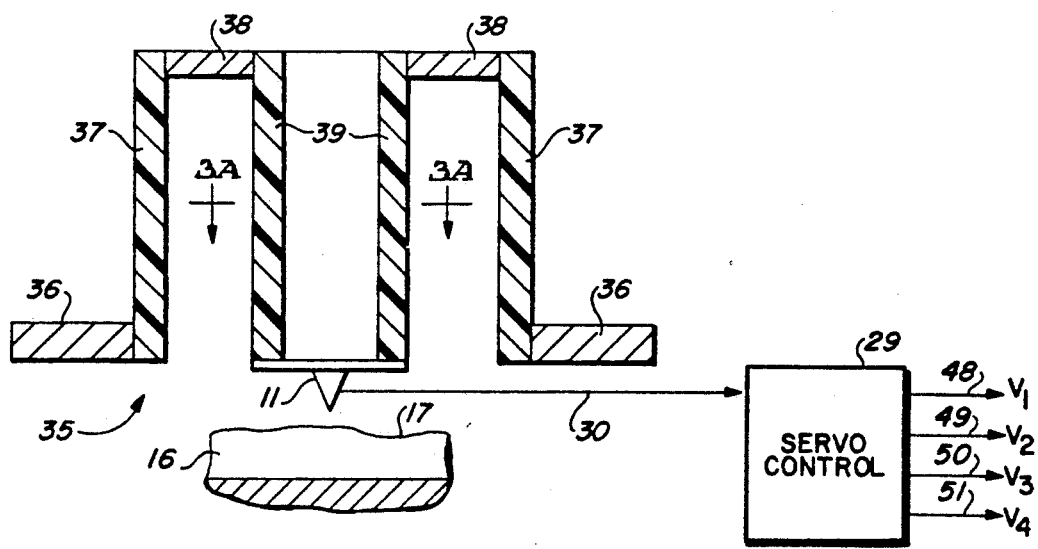
FIG. 3 is a section view of a scanning probe microscope of the present invention.
Figure 3A:
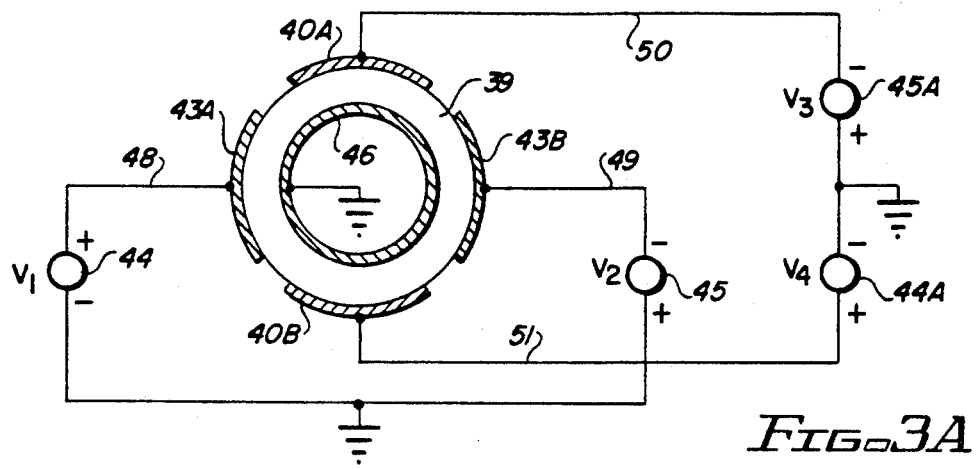
FIG. 3A is a section view taken along section line 3A-3A of FIG. 3.

Referring to FIGS. 3 and 3A, scanning probe microscope (SPM) 35 includes a fixed base 36. Base 36 is attached to the lower end of an outer piezoelectric tube 37. In one prototype that has been constructed and tested, the diameter of outer piezoelectric tube 37 is 0.5 inches, its length is 1.0 inches, and the wall thickness is approximately 0.030 inches. An annular collar 38 formed of MACOR ceramic is attached to the inner upper edge surface of piezoelectric tube 38, as illustrated. Collar 38 supports the upper end of an inner piezoelectric tube 39. In the prototype referred to above, the length of inner piezoelectric tube 39 is 1.0 inches, its outside diameter is 0.25 inches, and its wall thickness is approximately 0.030 inches. Piezoelectric tubes 37 and 39 are readily available from various companies, such as VERNATRON and STAVELEY SENSORS, INC.

A sensing probe 11 is attached to the lower end of inner piezoelectric tube 39, and senses a parameter (e.g., current, force, magnetic flux, light, etc.) that accurately indicates any change in the distance from the tip of probe 11 to the surface 17 of sample 16.

Referring to FIG. 3A, inner piezoelectric tube 39 has a continuous metal layer 46 coating its inner wall. Note that other embodiments of the invention may have the continuous metal layer coating on the inner wall of the piezoelectric tubes segmented, as shown by 40C and 40D in FIG. 3C, to further expand the scan range. Metal coating 46 can be nickel plating or the like, and may be electrically connected to a ground voltage, as shown. The outer surface of piezoelectric tube 39 is coated with four quadrant conductors 40A, 40B, 43A, and 43B which are located on diametrically opposed portions of the outer surface of piezoelectric tube 39. (For convenience of illustration, the quadrant conductors and inner conductors have been omitted from FIGS. 3 and 3B.) Quadrant conductors 43A and 43B are similarly diametrically opposed. Quadrant layers 40A,B and 43A,B can be nickel plating. The nickel electrodes are typically approximately 0.001 inches.

The diametrically opposed quadrant conductors can be attached to opposite polarity voltages. For example, in FIG. 3A, quadrant conductor 43A is connected to the positive terminal of voltage source 44, the negative terminal of which is connected to a ground conductor. Quadrant conductor 43B is connected to the negative terminal of a similar voltage source 45, the positive terminal of which is connected to the ground conductor. Quadrant conductors 40A and 40B are similarly connected to negative and positive voltage sources 45A and 44A, respectively. The voltage sources 44, 44A, 45, and 45A are continuously variable so as to produce either lateral or axial motion of probe tip 11 along the y and z axes. If the opposed voltage sources are varied in the same direction, rather than in opposite directions, vertical translation of the tip of probe 11 along the z axis is produced. (Alternatively, FIG. 3C shows how a single voltage source 45A can apply the same voltages in the same opposite polarities across opposite portions of the wall material of tube 39 as is accomplished by two equal voltage sources connected as shown in FIG. 3A.)

Conductor 30 in FIG. 3 conducts a signal representative of the current or other parameter sensed by probe 11 to a feedback control system 29. In response to that signal, control system 29 varies the voltages V1, V2, V3, and V4 on conductors 48, 49, 50, and 51, respectively, to adjust the z axis value or distance from the tip of probe 11 to the surface 17 for the present x,y coordinates. Likewise, control system 29 also varies the x and y coordinates to scan the surface 17 within the scan range of SPM 35.

Figure 3B:
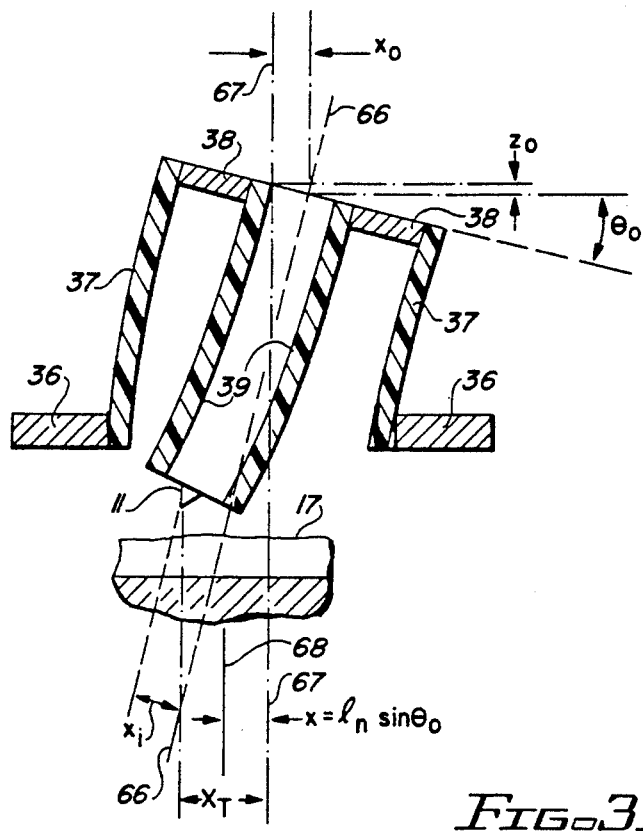
FIG. 3B is a diagram useful in describing the operation of the scanning probe microscope of FIG. 3.
Figure 3C:
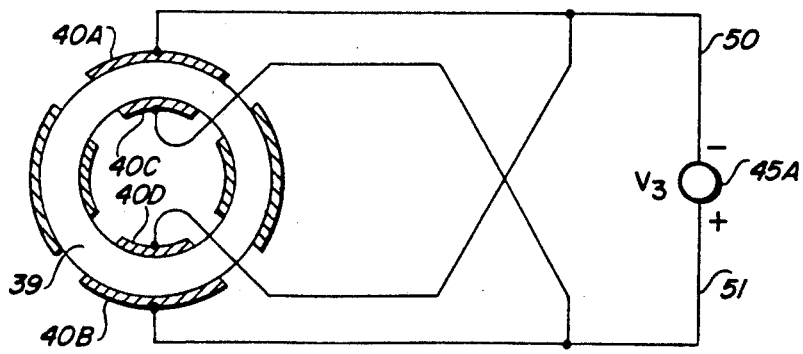
FIG. 3C is a diagram of a modification of the structure and operation illustrated in FIG. 3A.

FIG. 3B illustrates how piezoelectric tubes 37 and 39 can be deflected by appropriately applied quadrant voltages to produce lateral movement of probe tip 11 in the x, y, and z directions to achieve a large scan range.

As is apparent from FIG. 3B, probe tip 11 is subjected to tilt when the quadrant electrodes are electrically driven to produce sideways deformations of the inner and outer piezoelectric tubes 37 and 39 as shown. What is not apparent, however, is that various combinations of applied quadrant electrode voltages in opposite directions so as to produce deflection of piezoelectric tubes 37 and 39 generally as indicated results in lateral movement of the tip of probe 11 in an x,y plane. Vertical movement of the tip of probe 11 along the z axis is produced by varying the quadrant voltages in the same, rather than opposite directions. It has been found that the tilt is unimportant for most scanning purposes.

The transverse and axial translation of the lower end of inner tube 39 are given by the following equations. The transverse displacement of the probe 11 from the axis 66 in FIG. 3, which is the longitudinal axis of the uppermost undeflected part of inner tube 39, is $x_i$. The transverse displacement of the upper end of outer tube 37 relative to axis 67, which is the cylindrical axis of the lower undeflected portion of outer tube 37, is $x_o$. The total translation of the lower end of inner tube 39 relative to axis 67 and fixed base 36 is $x_T$, and represents the total travel of the probe 11 or other device attached to the lower end of inner tube 39. Both $x_i$ and $x_o$ can be computed according to the expression $$x_n = \frac{D_n \omega_n}{2 d_n V_n}\left[1 - \cos\left(\frac{2 l_n d_n V_n}{D_n \omega_n}\right)\right] - \frac{l_n^2 d_n V_n (\pi - 2)}{D_n \omega_n (\pi + 2)}, \quad (1)$$

where n can be either i (inner) or o (outer), $D_n$ is the tube diameter, $\omega_n$ is the tube wall thickness, $l_n$ is the tube length, and $d_n$ is the piezoelectric strain coefficient. The quantities $x_i$ and $x_o$ and also $x_T$ are shown in FIG. 3B. The dimensions $\theta_o$, $z_i$, and $z_o$ also are shown in FIG. 3B. The expression $x_T$ is given by the equation $$x_T = x_i \cos\theta_o + l_n \sin\theta_o - x_o, \quad (2)$$

where $l_n$ is the length of both outer piezoelectric tube 37 and inner piezoelectric tube 39. The portion $l_n \sin\theta_o$ of equation (2) corresponds to the distance indicated in FIG. 3B between axes 67 and 68, where axis 68 is the location of probe 11 with outer tube 37 deflected as shown and inner tube 39 undeflected.

$\theta_o$ is given by the expression $$\theta_o = \frac{2 l_n d_0 V_o}{D_0 \omega_0}, \quad (3)$$

where $V_o$ is the value of the equal and opposite voltages applied across opposite segments of the wall of outer piezoelectric tube 37 to cause it to deflect to the angle $\theta_o$.

The vertical translation $z_i$ or $z_o$ is given by the equation $$z_n = l_n\left[1 - \frac{D_n \omega_n}{2 l_n d_n V_n}\sin\left(\frac{2 l_n d_n V_n}{D_n \omega_n}\right)\right], \quad (4)$$

where $v_n$ is the value of the equal voltages applied across opposite segments of the wall of the piezoelectric tube under consideration to cause it to expand axially, n being equal to i for inner tube 39 and o for outer tube 37.

The total axial translation is given by the equation $$z_T = z_i - z_o + l_n(1 - \cos\theta_o). \quad (5)$$

Temperature compensation can be achieved by making outer piezoelectric tube 37 and inner piezoelectric tube 39 of the same material and same length. Alternately, if the piezoelectric materials of the inner and outer tubes are different, the resulting different sensitivities to applied quadrant conductor voltages can be compensated for by making the length of inner piezoelectric tube 39 correspondingly greater or less than the length of outer piezoelectric tube 37.

Figure 4:
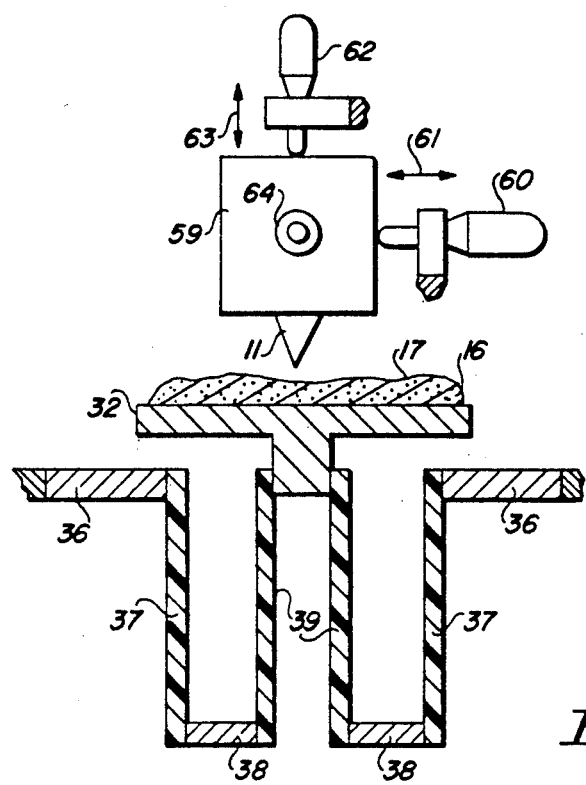
FIG. 4 is a diagram of an alternate embodiment of the scanning probe microscope in which the locations of the probe and sample are reversed.

Referring to FIG. 4, which shows an alternate embodiment of the SPM shown in FIG. 3, the inner piezoelectric tube 39 and outer piezoelectric tube 37 are inverted so that they extend below fixed base 36. The probe 11 is attached to the bottom of a micrometer adjustable head 59. Head 59 can be manually coarsely adjusted in the x, y, and z directions by means of conventional micrometers 60, 62, and 64. Micrometer 60 varies the position of probe 11 in the x direction as indicated by arrows 61, and micrometer 62 adjusts probe 11 in the z direction as indicated by arrow 63. Micrometer 64 adjusts probe 11 in the y direction, which is perpendicular to the page of the illustration.

Sample 16 is mounted on the upper end of inner piezoelectric tube 39 by means of a sample holder 32.

If the probe is difficult to move, the foregoing embodiment of the invention provides the advantages of moving the sample 16 instead of probe 11.

Figure 5:
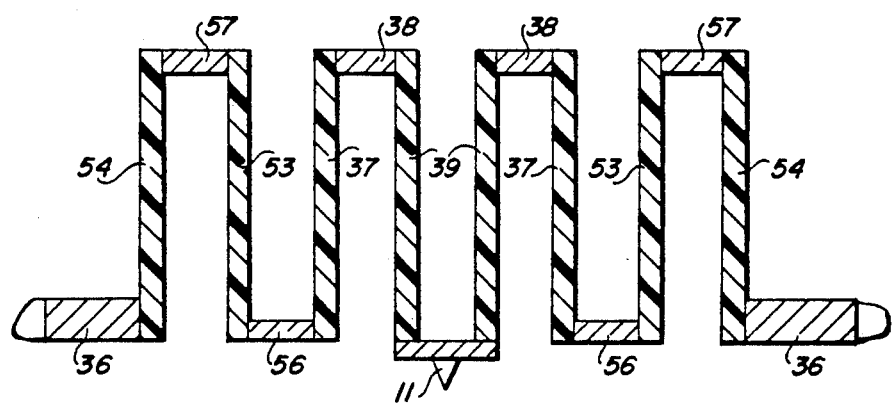
FIG. 5 is a drawing of an another alternate embodiment with additional "nested" pairs of cylindrical piezoelectric transducers, resulting increased scan range.

Referring to FIG. 5, the scan range of the embodiment of either FIG. 3 or FIG. 4 can be doubled by "nesting" piezoelectric tubes 37 and 39 within another pair of concentric piezoelectric tubes 53 and 54. The lower end of piezoelectric tube 53 is connected to the lower end of piezoelectric tube 37 by annular collar 56. The upper end of piezoelectric tube 53 is connected to the upper end of piezoelectric tube 54 by annular collar 57. The lower end of piezoelectric tube 54 is connected to base 36. The scan range can be further increased by adding yet more pairs of piezoelectric tubes in a similar fashion.

The feedback system including conductor 30, servo control circuit 29, controlled voltage sources $V_1$, $V_2$, $V_3$, and $V_4$, and the various outer segment conductors operate to control the position of probe 11 by sensing the position of the tip of probe 11 and by applying a voltage to the PZT translating device to keep the tip of probe 11 a constant distance from sample surface 17. The probe tip position is detected by using an electronic or optical signal that varies in accordance with the distance of the probe tip 11 from surface 17. For example, an STM (scanning tunneling microscope) uses a feedback signal produced by electrons tunneling between surface 17 and the tip of probe 11. The amount of current varies exponentially with the distance between the tip of probe 11 and surface 17. The feedback circuit senses the current and retracts the tip of probe 11 when the current exceeds a preselected threshold value. The tip of probe 11 is moved toward surface 17 when the current decreases, so the tip of probe 11 is kept at a constant distance from surface 17 during transverse scanning.

Figure 6:
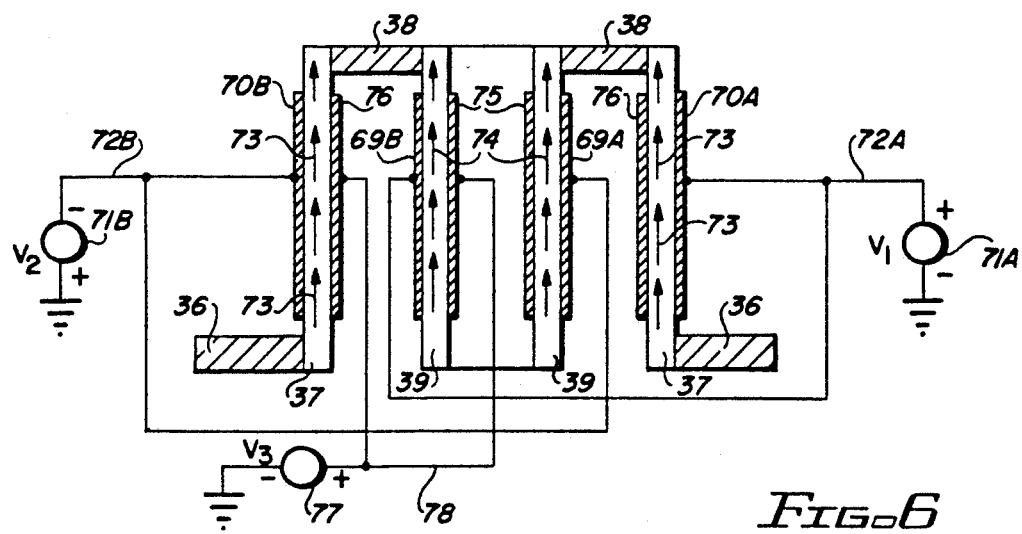
FIG. 6 is a perspective diagram illustrating opposed polarization of materials of the inner and outer scanning tubes.

Referring to FIG. 6, piezoelectric tubes 37 and 39 typically are composed of ceramic material which can be "polarized" by suitable application of high voltages across the ceramic material. If the material is polarized in one direction, subsequent application of a particular control voltage across the wall of the tube causes the ceramic piezoelectric material to expand along the length of the tube wall. However, if the ceramic piezoelectric material is polarized in the opposite direction by application of a suitable polarizing voltage, then application of the control voltage across the wall of the tube results in contraction of the ceramic material along the length of the wall. In FIG. 6, voltage source 71A applies a voltage $V_1$ via conductor 72A to outer conductive segment 70A on the right hand side of outer tube 37 and to conductive segment 69B on the outer left hand side of inner tube 39. Similarly, voltage source 71B applies voltage $-V_2$ via conductor 72B to conductive segment 70B on the outer surface of the left side of outer tube 37 and to conductive segment 69A on the outer surface of the right hand side of inner tube 39. Voltage source 77 applies voltage $V_3$ via conductor 78 to the continuous cylindrical inner conductor 76 on the inner surface of outer tube 37 and to the cylindrical continuous conductor 75 on the inner surface of inner tube 39.

In FIG. 6, the material of outer tube 37 has been polarized in one direction so as to cause axial expansion of outer tube 37 in the upward direction as indicated by the upward-pointing arrows 73 if, for example, $V_3$ is increased. The material of inner tube 39 has been polarized in the opposite direction so as to simultaneously cause contraction of inner tube 39 in the direction of the upward-pointing arrows 74 as $V_3$ is increased. It can be readily seen that increasing the magnitude of the voltages $V_1$ and $V_2$ produces transverse deflection of outer tube 37 and inner tube 39 in one direction, in the manner generally indicated in FIG. 3B.

Referring to FIGS. 7, 7A, and 7B, a scanning device 80 is shown that allows separate x, y, and z scan control voltages to control scanning motion of probe 11 in the x, y, and z directions. Outer tube 37 and inner tube 39 are constructed as described above. The upper section of outer tube 37 has four semicylindrical quadrant conductors or electrodes 81A, 82A, 87A, and 88A thereon. The upper section of the inner surface of outer tube 37 has thereon four quadrant conductors 81B, 82B, 87B, and 88B disposed opposite to and aligned with quadrant conductors 81A, 82A, 87A, and 88A, respectively. The lower section of outer tube 37 has an outer cylindrical conductor 93A disposed thereon, and the inner surface has a cylindrical conductor 93B of the same length thereon.

Similarly, the outer surface of inner tube 39 has four quadrant conductors 83A, 84A, 89A, and 90A thereon. The inner surface of inner tube 39 has four corresponding opposed quadrant conductors 83B, 84B, 89B, and 90B thereon and aligned with quadrant conductors 83A, 84A, 89A, and 90A, respectively.

The lower section of inner tube 39 has thereon an outer cylindrical conductor 94A thereon and an inner cylindrical conductor 94B.

Six scan control voltage sources 85, 86, 91, 92, 95, and 96, producing scan control voltages $V_{xo}$, $V_{xi}$, $V_{yo}$, $V_{yi}$, $V_{zo}$, $V_{zi}$, respectively. The voltage of the positive terminal of source 85 is designated $V_{xo}{}^+$ and the voltage of its negative terminal is designated $V_{xo}{}^-$. The voltages of the positive and negative terminals of the other scan control voltages are similarly designated. As shown in the drawings, control voltage source 85 applies $v_{xo}{}^+$ to quadrant electrodes 81A and 82B, and applies $V_{xi}{}^-$ to quadrant conductors 81B and 82A. Control voltage source 86 applies $V_{xi}{}^+$ to quadrant conductors 83B and 84A, and applies $V_{yo}{}^-$ to quadrant conductors 83A and 84B. Control voltage source 91 applies $V_{yo}{}^+$ to quadrant conductors 87A and 88B, and applies $V_{yo}{}^-$ to quadrant conductors 87B and 88A. Control voltage source 95 applies $V_{zo}{}^+$ to cylindrical conductor 93A and applies $V_{zo}{}^-$ to cylindrical conductor 93B. Control voltage source 96 applies $V_{zi}{}^+$ to cylindrical conductor 94A and $V_{zi}{}^-$ to cylindrical conductor 94B.

Thus, the portion of the x scan movement of probe 11 due to outer tube 37 is controlled by $V_{xo}$, and the amount of x scan movement produced by inner tube 39 is controlled by $V_{xi}$. Similarly, $V_{yo}$ controls the contribution of outer tube 37 to scanning motion of probe 11 in the y direction, and voltage $V_{yi}$ controls the contribution of scanning motion of probe 11 in the y direction by inner tube 39. $V_{zo}$ controls the contribution of scanning in the z direction by outer tube 37 and $V_{zi}$ controls the amount of scanning in the z direction by inner tube 39.

It can be seen that quadrant conductors involved in the x,y scanning process need to be located on the upper portion of inner tube 39 and outer tube 37, because the angle created by bending at the top of outer tube 37 is, in effect, multiplied by the length of inner tube 39 to extend the range of motion at the bottom of inner tube 39. Also, the angle created by bending in the middle of inner tube 39 is, in effect, multiplied by the length of the lower half of inner tube 39 to extend the range of motion. This leverage would work against enlarging the range of motion if the x,y scanning elements were at the bottom of the tubes.

Figure 8:
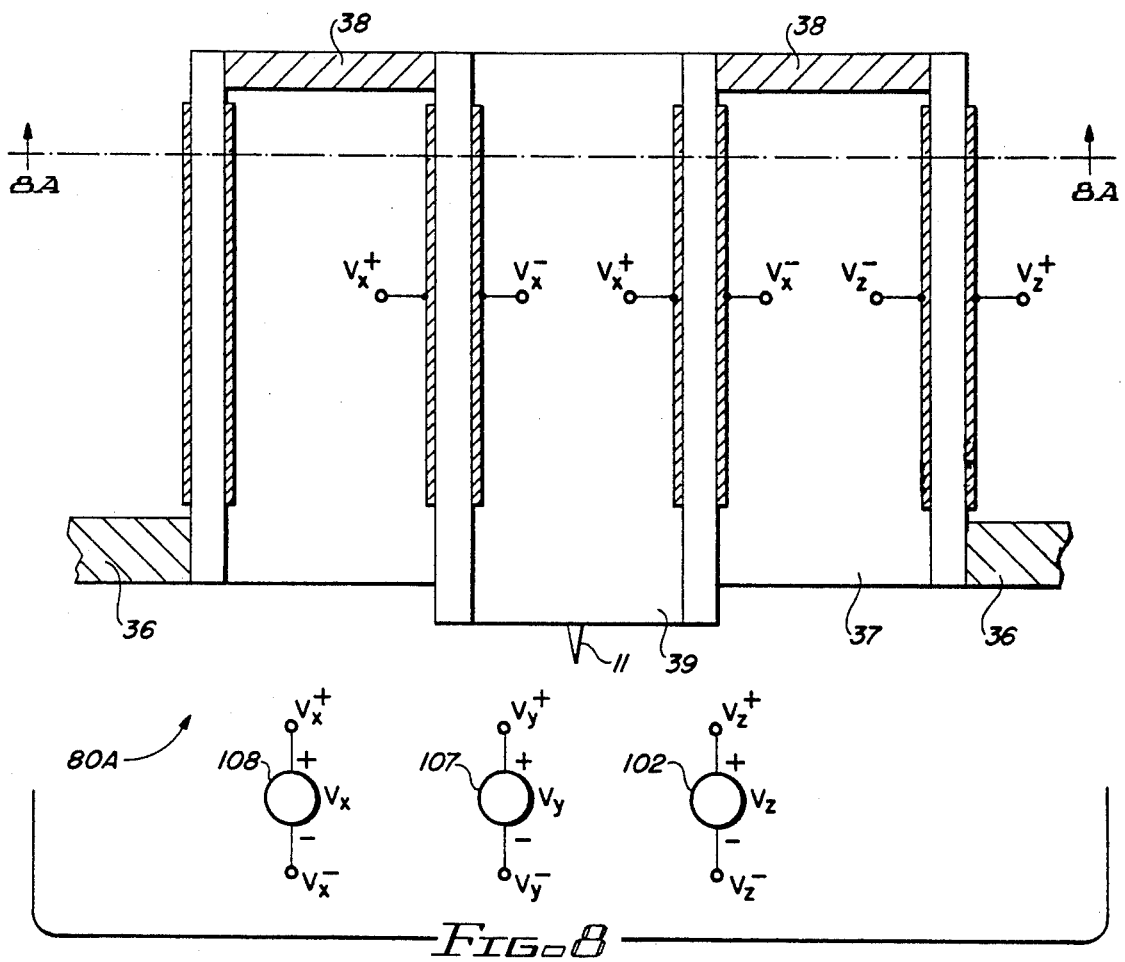
FIG. 8 is a section view diagram of another embodiment of the invention using voltages for controlling scanning in the x, y, and z directions.
Figure 8A:
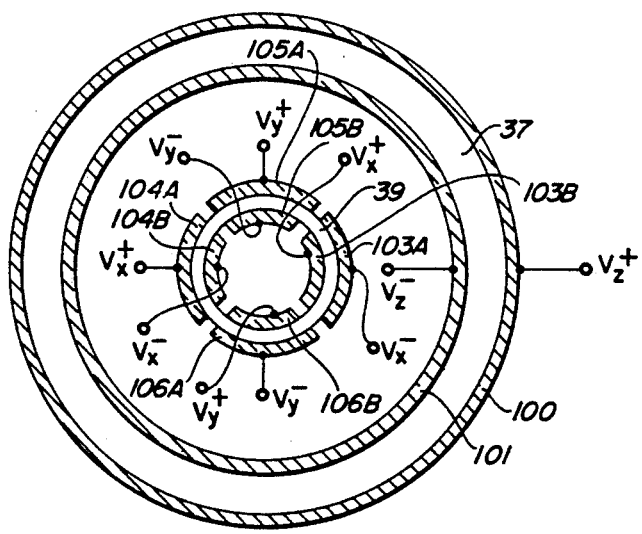
FIG. 8A is a section view taken along section line 8A—8A of FIG. 8.

Referring to FIGS. 8 and 8A, another structure is shown, in which continuous cylindrical outer and inner conductors or electrodes 100 and 101 are provided on the outer and inner 15 surfaces, respectively, of outer tube 37. Both conductors 100 and 101 are connected to voltage source 102 so that the voltage V2 controls scanning motion of probe 11 in the z direction.

Four quadrant conductors 103A, 104A, 105A, and 106A are provided on the outer surface of inner tube 39, and quadrant conductors 103B, 104B, 105B, and 106B are provided on the inner surface, so that inner quadrant conductors are opposed to and radially aligned with adjacent outer quadrant conductors as shown. The positive terminal of x control voltage source 107 is connected to outer quadrant conductor 104A and inner quadrant conductor 103B, and the negative terminal thereof is connected to inner quadrant conductor 104B and outer quadrant conductor 103A, so that the voltage $V_x$ controls scanning in the x direction. Y scan control voltage source 108 has its positive terminal connected to outer quadrant conductor 105A and inner quadrant conductor 106B, and has its negative terminal connected to inner quadrant conductor 105B and outer quadrant conductor 106A, so that $V_y$ controls scanning in the y direction. $V_z$, applied between outer cylindrical electrode 100 and inner cylindrical electrode 101, controls scanning motion of probe tip 11 in the z direction.

The above-described temperature-compensated scanning probe head has a number of significant advantages over the Lyding design. The SPM scanning head of the present invention is mechanically very small, for example, as small as about one inch long. Also, its scan range can be as much as approximately 200 microns, which is two to ten times greater than that achievable with the prior art.

The present invention distinguishes over the Lyding device in that Lyding uses the outer piezoelectric tube primarily for translation of the sample and uses the inner piezoelectric tube to perform all of the scanning functions. Lyding's temperature compensation is achieved by mounting both the probe tip and the sample to separate piezoelectric tubes of the same length and material anchored to the same support. In contrast, the present invention anchors only one end of the outer piezoelectric tube to a stationary support.

An advantage to using the above-described technique is that, in effect, individual piezoelectric elements, each defined by a separate quadrant conductor or a cylindrical conductor, are used to effectuate motion of the free end of the inner tube along each coordinate axis, respectively. Multi-axis control using the same piezoelectric element, for example, using a single quadrant conductor to influence motion in both the x and z directions, can cause one component of a combined control signal to affect the motion caused by another component of the combined control signal. The sensitivity of the piezoelectric device (i.e., the amount of expansion in a particular direction versus the voltage applied to the quadrant conductor or cylindrical conductor that, in effect, defines that piezoelectric device), is dependent on the voltage applied across the piezoelectric material thereof. Therefore, as the x control voltage changes, the sensitivity of the piezoelectric device in the z direction also is affected. The opposite also is true. Since the control voltage signal and the measured sensitivity of the piezoelectric device are used to determine the size of sample features, it is undesirable to have the sensitivity change.

There are many other types of scanning probes other than those with scanning tunneling mechanisms for atomic resolution "microscopy". For example, some types of probes measure atomic force, others measure magnetic forces. Others measure temperature changes. Optical probes or electrical force probes also may be used. The above-described scanning probe head can be utilized in conjunction with any of these.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, a conductor such as 30 could be used to energize a control probe 11 or a transducer, emitter, laser beam, or the like coupled to the bottom of tube 39 effectuate precisely controlled changes of surface 17. The tilting of the bottom of inner piezoelectric tube 39 due to bending of piezoelectric tubes 37 and 39 could be used to mechanically control an element, such as a beam steering mirror. The lateral translation of the bottom of inner piezoelectric tube 39 could be used to precisely control a mechanical element or operation. It is desirable to be able to control outer tube 37 to effectuate coarse adjustment or a large scan range and to control inner tube 38 to effectuate fine adjustment or a small scan range. One way of effectuating this is to provide the segmented control conductors such as 40A, 40B, etc. around only a relatively narrow band portion of inner tube 39 to reduce the amount of transverse and/or axial translation of the lower end of inner tube 39 relative to its upper end in response to a particular applied voltage change. To reduce hysteresis effects in the small z direction scanning, the outer tube in FIG. 8 may be composed of electrostrictive material instead of piezoelectric material.

What is claimed is:

1. A method of operating a scanning probe microscope, including a base, an inner piezoelectric tube, and an outer piezoelectric tube, the method comprising the steps of:
   (a) rigidly connecting a first end of the outer piezoelectric tube to said base;
   (b) supporting a first end of the inner piezoelectric tube in fixed relationship to a second end of the outer piezoelectric tube;
   (c) supporting a probe on one of a second end of the inner piezoelectric tube and a stationary support, the probe having a tip;
   (d) supporting a sample on the other of the second end of the inner piezoelectric tube and the stationary support;
   (e) applying a first selected voltage between conductive surfaces on the inner and outer surfaces of the outer piezoelectric tube to cause movement of the scanning probe in a first scan direction relative to a surface of the sample; and
   (f) applying a second selected voltage between conductive surfaces on the inner and outer surfaces of the inner piezoelectric tube to cause movement of the scanning probe in a second scan direction relative to the sample surface, wherein the first and second scan directions can be the same or different.

2. A scanning mechanical translation device comprising in combination:
(a) a base;
(b) an inner piezoelectric tube and an outer piezoelectric tube, the outer piezoelectric tube having a first end portion connected to said base;
(c) means connected to a second end of the outer piezoelectric tube and extending to and connected to a first end of the inner piezoelectric tube for supporting the first end of the inner piezoelectric tube in fixed relationship to the second end of the outer piezoelectric tube;
(d) a utilization device connected to a second end of the inner piezoelectric tube;
(e) first means for applying a first selected voltage between first and second conductors located in opposed relationship to each other on inner and outer surfaces, respectively, of the outer piezoelectric tube to cause movement of the utilization device in a first scan direction; and
(f) second means for applying a second selected voltage between third and fourth conductors located in opposed relationship to each other on inner and outer surfaces, respectively, of the inner piezoelectric tube to cause movement of the utilization device in a second scan direction.

3. The scanning mechanical translation device of claim 2 wherein the first and second scan directions are identical.

4. The scanning mechanical translation device of claim 2 wherein the first and second scan directions are different.

5. The scanning mechanical translation device of claim 4 wherein the first and second conductors on the outer piezoelectric tube constitute a first pair of quadrant conductors thereof, the scanning mechanical translation device further including a similar second pair of quadrant conductors located on an opposite side of the outer piezoelectric tube, the first means also applying the first selected voltage between third and fourth conductors constituting the second pair of quadrant conductors on the outer piezoelectric tube to contribute to movement of the utilization device in the first scan direction.

6. The scanning mechanical translation device of claim 5 further including third and fourth pairs of quadrant conductors on the outer piezoelectric tube, and third means for applying a third selected voltage between fifth and sixth conductors constituting the third pair of quadrant conductors and between seventh and eighth conductors constituting the fourth pair of quadrant conductors, to cause movement of the utilization device in a third scan direction.

7. The scanning mechanical translation device of claim 6 wherein the third and fourth conductors on the inner piezoelectric tube are cylindrical conductors, the first scan direction being an x scan direction, the second scan direction being a z scan direction, and the third scan direction being a y scan direction.

8. The scanning mechanical translation device of claim 7 wherein the third and fourth conductors are disposed on a portion of the inner piezoelectric tube adjacent to the second end thereof, the scanning mechanical translation device further including fifth, sixth, seventh, and eighth pairs of quadrant conductors disposed on a portion of the inner piezoelectric tube adjacent to the first end thereof, aligned with first, second, third, and fourth pairs of quadrant conductors, respectively, and means for applying a fourth selected voltage to the fifth and sixth pairs of quadrant conductors to contribute to movement of the utilization device in the first scan direction, and a fifth selected voltage to the seventh and eighth pairs of quadrant conductors to contribute to movement of the utilization device in the third scan direction.

9. The scanning mechanical translation device of claim 4 wherein the first and second conductors on the outer piezoelectric tube are cylindrical conductors.

10. The scanning mechanical translation device of claim 9 wherein the third and fourth conductors on the inner piezoelectric tube constitute a first pair of quadrant conductors thereof, the scanning mechanical translation device further including a similar second pair of quadrant conductors located on an opposite side of inner piezoelectric tube consisting of fifth and sixth conductors, the second means also applying the second selected voltage between the fifth and sixth conductors to contribute to movement of utilization in the second scan direction.

11. The scanning mechanical translation device of claim 10 further including third and fourth pairs of quadrant conductors and third means for applying a third selected voltage between seventh and eighth conductors constituting the third pair of quadrant conductors and between ninth and tenth conductors constituting the fourth pair of quadrant conductors, to cause movement of the utilization device in a third scan direction.

12. The scanning mechanical translation device of claim 11 wherein the first scan direction is a z scan direction, the second scan direction is a x scan direction, and the third scan direction is a y scan direction.

13. A scanning mechanical translation device comprising in combination:
(a) a base;
(b) an inner piezoelectric element and an outer piezoelectric element, the outer piezoelectric element having a first end portion connected to said base;
(c) means connected to a second end of the outer piezoelectric element and extending to and connected to a first end of the inner piezoelectric element for supporting the first end of the inner piezoelectric element in fixed relationship to the second end of the outer piezoelectric element;
(d) a utilization device connected to a second end of the inner piezoelectric element;
(e) first means for applying a first selected voltage between first and second conductors located in opposed relationship to each other on inner and outer surfaces, respectively, of the outer piezoelectric element to cause movement of the utilization device in a first scan direction; and
(f) second means for applying a second selected voltage between third and fourth conductors located in opposed relationship to each other on inner and outer surfaces, respectively, of the inner piezoelectric element to cause movement of the utilization device in a second scan direction.

14. A scanning mechanical translation device comprising in combination:
(a) a base;

(b) a first piezoelectric element and a second piezoelectric element, the second piezoelectric element having a first end portion connected to said base;

(c) means connected to a second end of the second piezoelectric element and extending to and connected to a first end of the first piezoelectric element for supporting the first end of the first piezoelectric element in fixed relationship to the second end of the second piezoelectric element, the second piezoelectric element extending alongside of the first piezoelectric element so that the second end of the second piezoelectric element is located generally adjacent to the first end of the first piezoelectric element;

(d) a utilization device connected to a second end of the first piezoelectric element;

(e) first means for applying a first selected voltage between first and second conductors located in opposed relationship to each other on first and second surfaces, respectively, of the second piezoelectric element to cause movement of the utilization device in a first scan direction; and (f) second means for applying a second selected voltage between third and fourth conductors located in opposed relationship to each other on first and second surfaces, respectively, of the first piezoelectric element to cause movement of the utilization device in a second scan direction.

15. A scanning mechanical translation device comprising in combination:

(a) a base;

(b) a first electromechanical transducer element and a second electromechanical transducer element, the second electromechanical transducer element having a first end portion connected to said base;

(c) means connected to a second end of the second electromechanical transducer element and extending to and connected to a first end of the first electromechanical transducer element for supporting the first end of the first electromechanical transducer element in fixed relationship to the second end of the second electromechanical transducer element, the second electromechanical transducer element extending alongside of the first electromechanical transducer element so that the second end of the second electromechanical transducer element is located generally adjacent to the first end of the first electromechanical transducer element;

(d) a utilization device connected to a second end of the first electromechanical transducer element;

(e) first means for applying a first selected voltage between first and second conductors located in opposed relationship to each other on first and second surfaces, respectively, of the second electromechanical transducer element to cause movement of the utilization device in a first scan direction; and (f) second means for applying a second selected voltage between third and fourth conductors located in opposed relationship to each other on first and second surfaces, respectively, of the first electromechanical transducer element to cause movement of the utilization device in a second scan direction.

16. The scanning mechanical translation device of claim 15 wherein the first electromechanical transducer element is an electrostrictive element and the second electromechanical transducer element is a piezoelectric element.

* * * * *